United States Patent
Ido (10) Patent No.: US 7,443,727 B2
(45) Date of Patent: Oct. 28, 2008

(54) SEMICONDUCTOR MEMORY DEVICE HAVING REDUNDANCY CIRCUIT FOR REPLACING A DEFECTIVE PART

(75) Inventor: Masamiti Ido, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 313 days.

(21) Appl. No.: 11/453,883

(22) Filed: Jun. 16, 2006

(65) Prior Publication Data
US 2006/0291306 A1 Dec. 28, 2006

(30) Foreign Application Priority Data
Jun. 22, 2005 (JP) ............................. 2005-181452

(51) Int. Cl.
*G11C 11/34* (2006.01)
(52) U.S. Cl. ..................... 365/185.09; 365/185.23; 365/189.07; 365/200
(58) Field of Classification Search ........... 365/185.09, 365/185.23, 189.07, 200
See application file for complete search history.

(56) References Cited

U.S. PATENT DOCUMENTS 5,930,194 A * 7/1999 Yamagata et al. ...... 365/230.03
7,035,152 B1 * 4/2006 Bae et al. .................... 365/200

FOREIGN PATENT DOCUMENTS

JP 7-320496 12/1995

* cited by examiner

*Primary Examiner*—Tuan T. Nguyen
(74) *Attorney, Agent, or Firm*—McGinn IP Law Group, PLLC (57) ABSTRACT

A semiconductor memory device has: a memory cell array including a normal region and a redundancy region; a first decoder configured to decode an address signal to generate a first decode signal; a first driver configured to select a memory cell corresponding to the first decode signal in the normal region; and a second driver configured to select a memory cell in the redundancy region when a memory cell specified by the address signal is included in a replacement-target sector in the normal region. In the first driver, the first decode signal associated with the replacement-target sector is masked continuously.

12 Claims, 12 Drawing Sheets

SEMICONDUCTOR MEMORY DEVICE HAVING REDUNDANCY CIRCUIT FOR REPLACING A DEFECTIVE PART

BACKGROUND OF THE INVENTION

1. Field of the Invention

The present invention relates to a semiconductor memory device. In particular, the present invention relates to a redundancy technique for replacing a defective part in a semiconductor memory device.

2. Description of the Related Art

Figure 1:
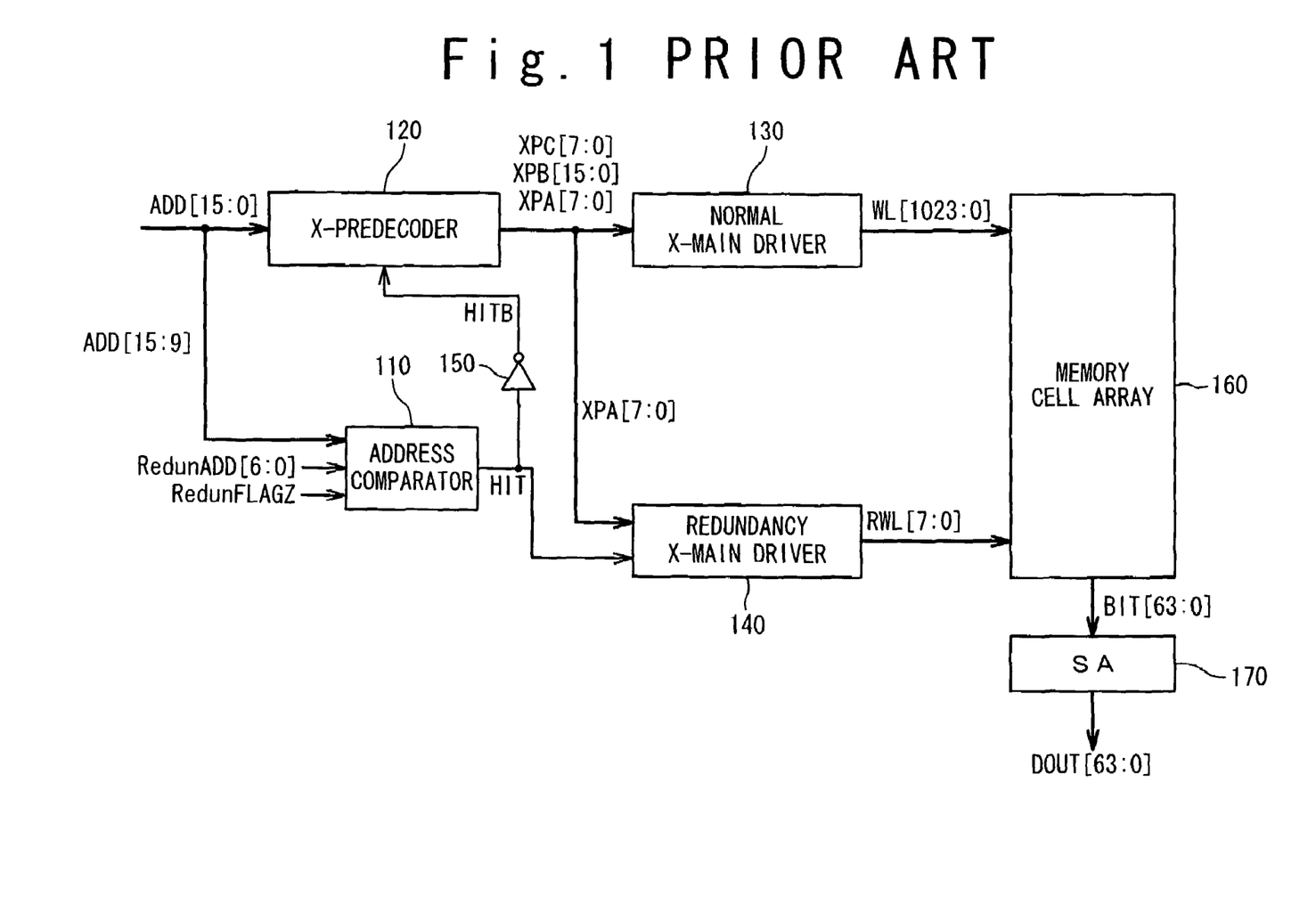
FIG. 1 is a block diagram showing a configuration of a nonvolatile semiconductor memory device according to a conventional technique.

A redundancy circuit for replacing a defective part in a semiconductor memory device is widely known. For example, Japanese Laid Open Patent Application JP-A-Heisei 7-320496 describes a nonvolatile semiconductor memory device provided with such a redundancy circuit. FIG. 1 shows a semiconductor memory device including a feature of the circuit configuration disclosed in the patent document, Japanese Laid Open Patent Application (JP-A-Heisei, 7-320496). The semiconductor memory device is provided with an address comparator 110, an X-predecoder 120, a normal X-main driver 130, a redundancy X-main driver 140, an inverter 150, a memory cell array 160 and a sense amplifier 170.

A case will be described as an example, in which 1024 word lines are provided and the replacement with redundancy word lines is performed with respect to eight word lines. That is, the 1024 word lines WL[1023:0] are provided in a normal region of the memory cell array 160, and eight redundancy word lines RWL[7:0] are provided in a redundancy region of the memory cell array 160. The 1024 word lines are sectioned into 128 sectors each of which includes eight word lines. Among the 128 sectors, a sector including a defective word line or a defective memory cell is hereinafter referred to as a "replacement-target sector". A rescue of the defective part is carried out by replacing eight word lines WL included in the replacement-target sector with the eight redundancy word lines RWL included in the redundancy region.

An address signal ADD[15:0] is a signal specifying an address of a memory cell to be accessed. In the address signal ADD[15:0], ADD[8:3] of 6 bits is used for selecting any of 64 bit lines. The remaining ADD[15:9, 2:0] of 10 bits is used for selecting any of 1024 word lines WL[1023:0]. More specifically, any one of the 128 sectors is specified by ADD[15:9] of 7 bits, and any one of eight word lines included in the specified sector is specified by ADD[2:0] of 3 bits.

Further, the replacement-target sector in the 128 sectors is specified by a redundancy address signal RedunADD[6:0] of 7 bits. A redundancy flag RedunFLAGZ is a flag indicating whether or not the replacement (rescue) of word lines should be carried out. For example, the replacement is not carried out when the redundancy flag RedunFLAGZ is set to "H (High Level)", while the replacement is carried out when the redundancy flag RedunFLAGZ is set to "L (Low Level)".

Figure 2:
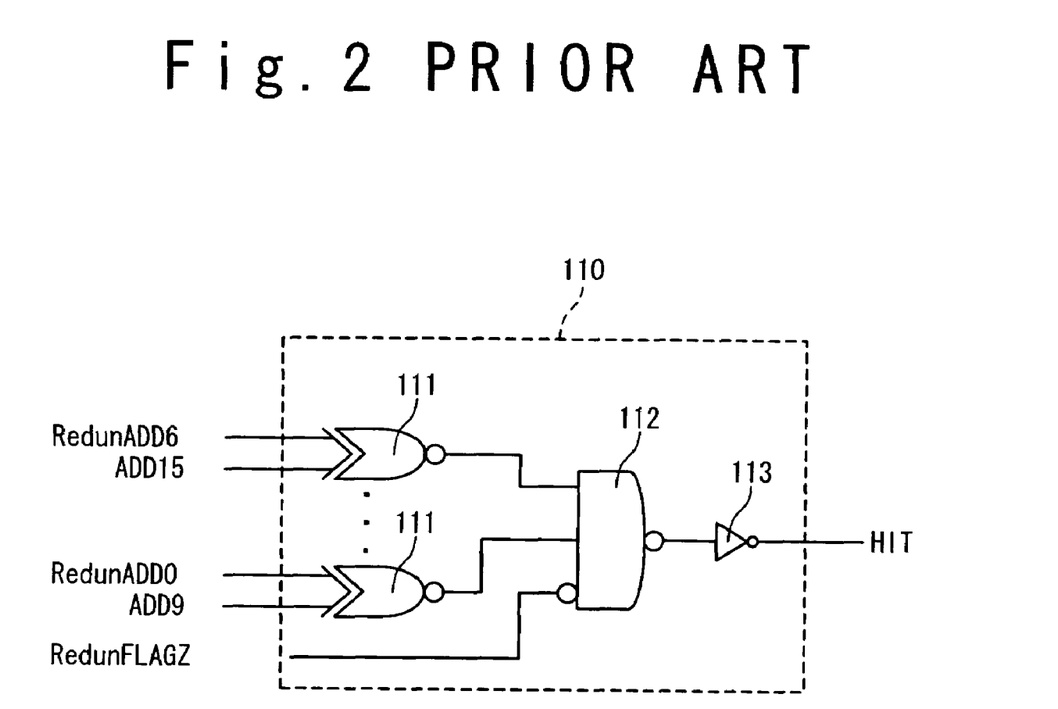
FIG. 2 is a circuit diagram showing an address comparator according to the conventional technique.

The address comparator 110 shown in FIG. 1 has a circuit configuration as shown in FIG. 2. The address comparator 110 compares between the address signal ADD[15:9] specifying a sector and the redundancy address signal RedunADD[6:0] specifying the replacement-target sector. More specifically, respective bits of the address signal ADD[15:9] and respective bits of the redundancy address signal RedunADD[6:0] are input to respective of a plurality of EXNOR circuits 111. Respective outputs of the EXNOR circuits 111 and an inversion signal of the redundancy flag RedunFLAGZ are input to a NAND circuit 112. An output of the NAND circuit 112 is input to an inverter 113 and the inverter 113 outputs a hit signal HIT.

When the redundancy flag RedunFLAGZ is "L" and the address signal ADD[15:9] matches the redundancy address signal RedunAdd[6:0] in all bits, the output hit signal HIT is "H". On the other hand, when the redundancy flag RedunFLAGZ is "H", or the address signal ADD[15:9] does not match the redundancy address signal RedunAdd[6:0] in at least any one bit, the output hit signal HIT is "L".

The hit signal HIT is supplied to the redundancy X-main driver 140 and the inverter 150 shown in FIG. 1. The inverter 150 outputs an inversion signal of the hit signal HIT as an inversion hit signal HITB to the X-predecoder 120.

Figure 3:
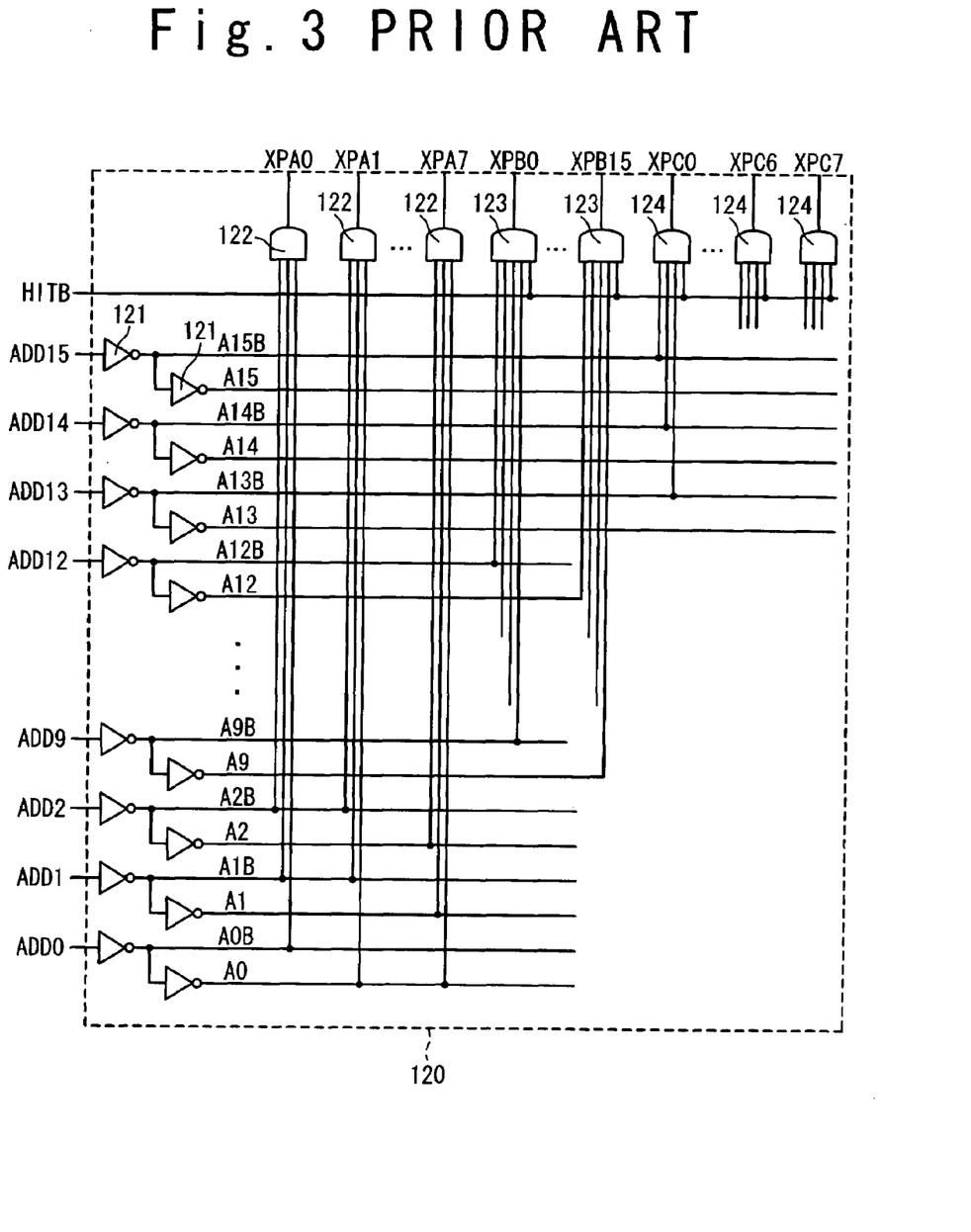
FIG. 3 is a circuit diagram showing an X-predecoder according to the conventional technique.

The X-predecoder 120 shown in FIG. 1 has a circuit configuration as shown in FIG. 3. The X-predecoder 120 decodes the address signal ADD[15:9, 2:0]. More specifically, respective bits of the address signal ADD[15:9, 2:0] are input to respective of a plurality of inverters 121, and signals A0B to A15B are output from respective of the plurality of inverters 121. Further, the signals A0B to A15B are input to respective of a plurality of other inverters 121, and signals A0 to A15 are output from respective of the plurality of other inverters 121.

Input to each of eight AND circuits 122 are any of the signals A2B and A2, any of the signals A1B and A1, and any of the signals A0B and A0. Thus, respective of the eight AND circuits 122 generate respective bits of a predecode signal XPA[7:0]. Further, input to each of 16 AND circuits 123 are any of the signals A12B and A12, any of the signals A11B and A11, any of the signals A10B and A10, any of the signals A9B and A9, and the inversion hit signal HITB. Thus, respective of the 16 AND circuits 123 generate respective bits of a predecode signal XPB[15:0]. Further, input to each of eight AND circuits 124 are any of the signals A15B and A15, any of the signals A14B and A14, any of the signals A13B and A13, and the inversion hit signal HITB. Thus, respective of the eight AND circuits 124 generate respective bits of a predecode signal XPC[7:0].

In a case when the inversion hit signal HITB is "H", any one bit of the predecode signal XPA[7:0], any one bit of the predecode signal XPB[15:0], and any one bit of the predecode signal XPC[7:0] become "H". Here, the predecode signal XPB[15:0] and the predecode signal XPC[7:0] corresponding to the address signal ADD[15:9] are used for selecting any of the 128 sectors. More specifically, any one of eight blocks each including 128 word lines is selected by the predecode signal XPC[7:0]. Then, any one of 16 sectors included in the selected block is selected by the predecode signal XPB[15:0]. Further, any one of eight word lines included in the selected sector is selected by the predecode signal XPA[7:0] corresponding to the address signal [2:0].

On the other hand, in a case when the inversion hit signal HITB is "L", all bits of the predecode signal XPB[15:0] and the predecode signal XPC[7:0] become "L", and thus no sector in the normal region is selected. In other words, when the address signal ADD[15:9] matches the redundancy address signal RedunAdd[6:0] in all bits, no sector in the normal region is selected. As described above, the operation of the X-predecoder 120 depends on the inversion hit signal HITB, and the X-predecoder 120 deactivates the predecode signals XPB and XPC when the replacement-target sector is specified by the address signal ADD.

Figure 4:
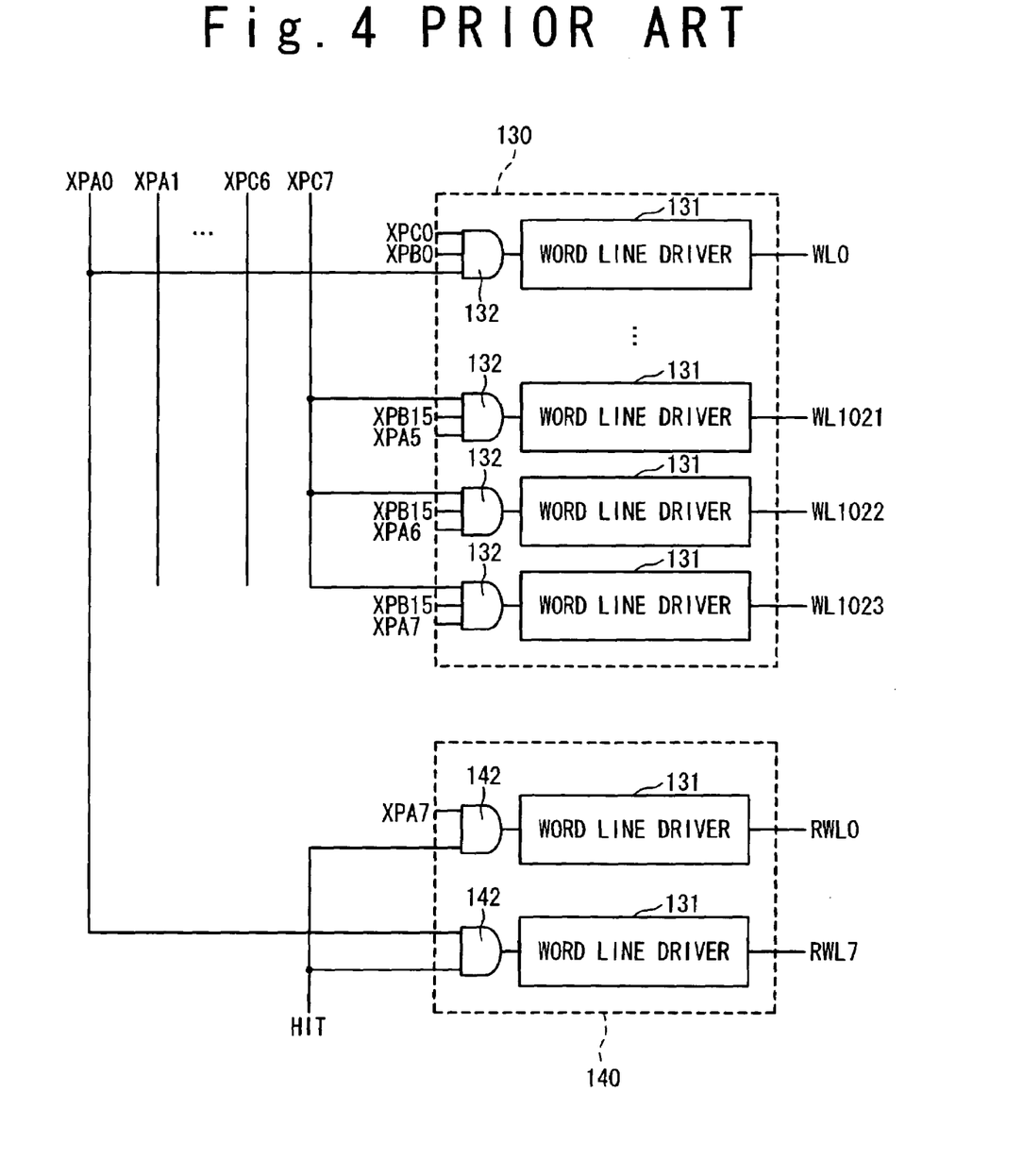
FIG. 4 is a circuit block diagram showing an X-main driver according to the conventional technique.

The normal X-main driver 130 and the redundancy X-main driver 140 shown in FIG. 1 have a circuit configuration as shown in FIG. 4. The normal X-main driver 130 is provided with 1024 word line drivers 131 connected to respective of the word lines WL[1023:0] of the normal region and 1024 AND circuits 132 connected to respective of the word line drivers 131. Input to each of the 1024 AND circuits 132 are any bit of the predecode signal XPA[7:0], any bit of the predecode signal XPB[15:0], and any bit of the predecode signal XPC[7:0]. An output of each AND circuit 132 is input to the corresponding word line driver 131.

The redundancy X-main driver 140 is provided with eight word line drivers 131 connected to respective of the redundancy word lines RWL[7:0] of the redundancy region and eight AND circuits 142 connected to respective of the word line drivers 131. Input to each of the eight AND circuits 142 are the hit signal HIT as well as any bit of the predecode signal XPA[7:0]. An output of each AND circuit 142 is input to the corresponding word line driver 131.

In a case when the HIT signal is "L", the redundancy X-main driver 140 is deactivated. In this case, one word line driver 131 corresponding to a memory cell specified by the address signal ADD[15:9, 2:0] is selected in the normal X-main driver 130. On the other hand, in a case when the HIT signal is "H", namely, in a case when the replacement-target sector is specified, all the predecode signals XPB and XPC become "L" and hence no word line driver 131 is selected in the normal X-main driver 130. Instead, the redundancy X-main driver 140 is activated, and one word line driver 131 specified by the predecode signal XPA[7:0] is selected in the redundancy X-main driver 140. The selected one word line driver 131 drives the corresponding one word line WL or one redundancy word line RWL. In this manner, the replacement of the word line WL in the replacement-target sector with the redundancy word line RWL is realized.

Next, an operation from an address determination to the word line driving will be explained below with reference to a timing chart shown in FIG. 5. In the example shown below, the following situation is considered: when the address signal ADD[15:0] is "0000H" or "FFFFH", a memory cell included in a sector other than the replacement-target sector is designated. When the address signal ADD[15:0] is "0200H", a memory cell included in the replacement-target sector is designated. When the address signal ADD[15:0] is "0000H", a word line WL0 is driven. When the address signal ADD[15:0] is "0200H", a redundancy word line RWL0 is driven. When the address signal ADD[15:0] is "FFFFH", a word line WL1023 is driven. In the X-predecoder 120, the time from the input of the address signal ADD[15:0] and the inversion hit signal HITB to the output of the predecode signals XPA to XPC is 4 ns, which is referred to as a "predecode time". Furthermore, in the address comparator 110, the time from the input of the address signal ADD[15:9] to the output of the hit signal HIT is 4 ns, which is referred to as a "address comparison time".

Figure 5:
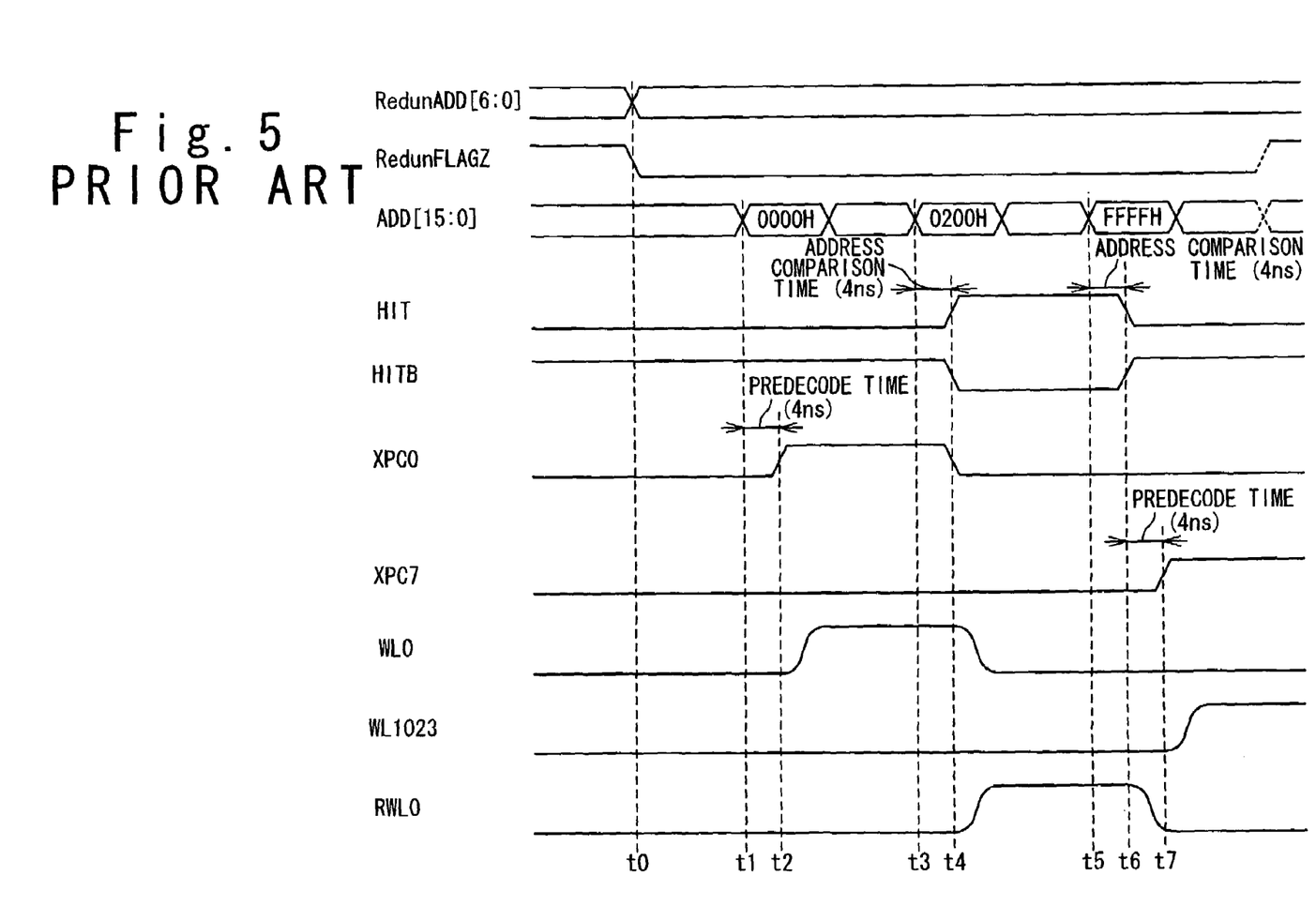
FIG. 5 is a timing chart showing an operation of a nonvolatile semiconductor memory device according to the conventional technique.

With reference to FIG. 5, the redundancy flag RedunFLAGZ changes to "L" at time t0, which enables the replacement of word lines. Further, the redundancy address signal RedunADD[6:0] of "0000001", which is the same as the upper 7 bits of "0200H", is input to the address comparator 110.

Next, at time t1, a read address is determined and the address signal ADD[15:0] becomes "0000H". In this case, since the address signal ADD[15:9] does not match the redundancy address signal RedunADD[6:0], the hit signal HIT remains "L". At time t2 the predecode time (4 ns) after the time t1, the X-predecoder 120 outputs the predecode signals XPA, XPB and XPC to the normal X-main driver 130 (only the XPC0 and XPC7 are shown in FIG. 5). As a result, the word line WL0 in the normal region is driven.

At time t3, a next read address is determined and the address signal ADD[15:0] becomes "0200H". In this case, the address signal ADD[15:9] matches the redundancy address signal RedunADD[6:0]. Therefore, at time t4 the address comparison time (4 ns) after the time t3, the hit signal HIT becomes "H". As a result, the redundancy X-main driver 140 is activated, and the redundancy word line RWL0 in the redundancy region is driven. Further, the inversion hit signal HITB becomes "L" at the time t4, and the predecode signal XPC0 becomes "L". As a result, the driving of the word line WL0 in the normal region is stopped.

At time t5, a next read address is determined and the address signal ADD[15:0] becomes "FFFFH". In this case, the address signal ADD[15:9] does not match the redundancy address signal RedunADD[6:0]. Therefore, at time t6 the address comparison time (4 ns) after the time t5, the hit signal HIT becomes "L". As a result, the redundancy X-main driver 140 is deactivated, and the driving of the redundancy word line RWL0 in the redundancy region is stopped. Further, the inversion hit signal HITB becomes "H" at the time t6, and the X-predecoder 120 starts the predecoding operation. At time t7 the predecode time (4 ns) after the time t6, the predecode signal XPC7 becomes "H". As a result, the word line WL1023 in the normal region is driven.

It should be noted that the bit line is selected in accordance with the address signal ADD[8:3] by a Y-decoder and a Y-selector which are not shown in FIG. 1. As a result, a target memory cell specified by the address signal ADD[15:0] is selected. A read data BIT read out from the selected memory cell is output as an output data DOUT through the sense amplifier 170.

SUMMARY OF THE INVENTION

The inventor of the present application has now discovered the following problem with regard to the above-mentioned conventional technique. That is, the timing of the word line driving is delayed in a case where the target memory cell to be accessed transits from the redundancy region to the normal region. For example, as shown in FIG. 5, both the address comparison time (4 ns) and the predecode time (4 ns) are necessary for driving the word line WL1023 at the time t7 after the address signal "FFFFH" is input at the time t5. This is because the operation of the X-predecoder 120 depends on the result of comparison by the address comparator 110, namely, on the hit signal HIT. In the above case of the transition from the redundancy region to the normal region, the address comparator 110 first executes the comparison operation. Consequently, the inversion hit signal HITB is changed and whole the X-predecoder 120 is activated. After that, the X-predecoder 120 executes the predecode operation and outputs the predecode signals XPA, XPB and XPC. Next, the normal X-main driver 130 drives the word line WL1023. Therefore, a rise timing of drive voltage for driving a word line WL is delayed by 4 ns, as compared with a transition from the normal region to the normal region or a transition from the normal region to the redundancy region.

As mentioned above, when the conventional redundancy circuit is applied, the time from the address determination to the word line driving is more likely to increase. If the timing of the word line driving is delayed, a switching of the read-target memory cell connected to the selected word line is also delayed. This means reduction of read speed with respect to the read-target memory cell. According to the conventional redundancy circuit, the read speed is reduced although the defective part of the memory cell array is rescued.

In an aspect of the present invention, a semiconductor memory device has a memory cell array including a normal region and a redundancy region, a first decoder, a first driver and a second driver. The first decoder decodes an address signal to generate a first decode signal. The first driver selects a memory cell corresponding to the first decode signal in the normal region. The second driver selects a memory cell in the redundancy region, when a memory cell specified by the address signal is included in a replacement-target sector in the normal region. In the first driver, the first decode signal associated with the replacement-target sector is masked continuously.

In the semiconductor memory device, the first decoder and the first driver play a role of selecting a memory cell in the normal region. Here, it is not necessary to deactivate the first decoder for setting the replacement-target sector in the normal region to an unselected state. Instead, according to the present invention, the first decode signal associated with the replacement-target sector is continuously masked in the first driver. As a result, it is possible to continuously set the replacement-target sector to the unselected state.

As described above, what plays a role of setting the replacement-target sector to the unselected state is not the first decoder but the first driver. It is therefore possible to always set the first decoder to an activated state, regardless of whether an access-target memory cell is included in the replacement-target sector or not. The first decoder can continuously decode the address signal and continuously supply the first decode signal to the first driver. When the address signal is changed, the first decoder immediately initiates the decoding of the new address signal. Even in a case where the access-target memory cell transits from the redundancy region to the normal region, it is not necessary to wait for the first decoder to be activated. Therefore, the time from the address determination to the memory cell switching is reduced as compared with the conventional technique. That is to say, the access speed with respect to the memory cell is improved.

Moreover, the replacement-target sector is continuously in the unselected state, and the second driver selects a memory cell in the redundancy region if the access-target memory cell is included in the replacement-target sector of the normal region. Thus, the replacement of the defective part in the memory cell array can be realized. As described above, it is possible by using the redundancy technology of the present invention to rescue the defective part of the memory cell array, without reducing the access speed with respect to the access-target memory cell.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor memory device according to an embodiment of the present invention is provided with a redundancy circuit for replacing a defective part in a memory cell array. Described in the present embodiment is a case where the redundancy circuit is provided in a word line side, namely, a case where the defective part is rescued by replacing word lines. It goes without saying that the redundancy circuit according to the present invention can be provided in a bit line side. Effects according to the present invention can be obtained in either case.

Figure 6:
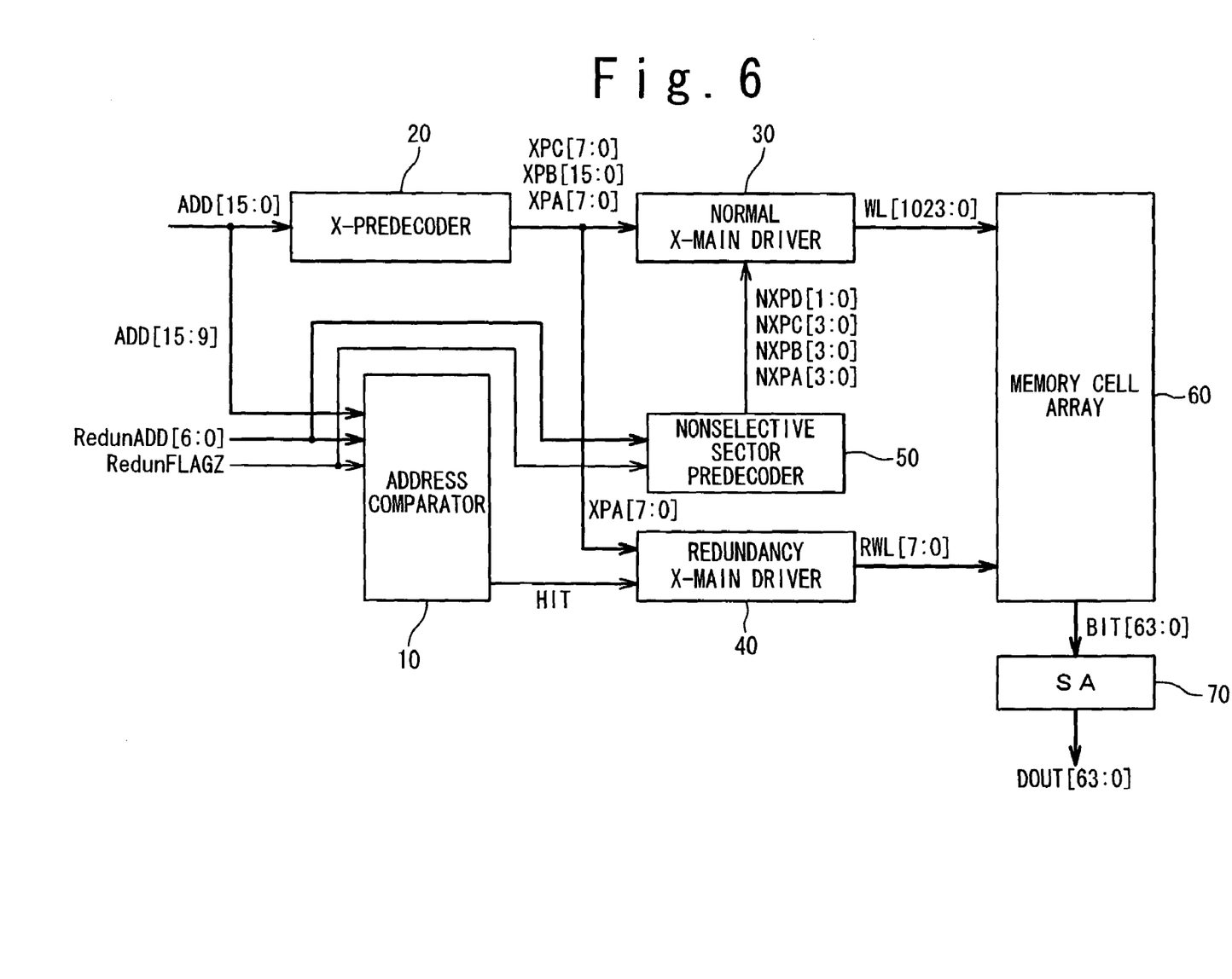
FIG. 6 is a block diagram showing a configuration of a semiconductor memory device according to an embodiment of the present invention.

FIG. 6 shows a configuration of a semiconductor memory device according to the present embodiment. The semiconductor memory device is provided with an address comparator 10, an X-predecoder 20, a normal X-main driver 30, a redundancy X-main driver 40, a nonselective sector predecoder 50, a memory cell array 60, and a sense amplifier 70.

A case will be described as an example, in which 1024 word lines are provided and the replacement with redundancy word lines is performed with respect to eight word lines. That is, the 1024 word lines WL[1023:0] are provided in a normal region of the memory cell array 60, and eight redundancy word lines RWL[7:0] are provided in a redundancy region of the memory cell array 60. The 1024 word lines are sectioned into 128 sectors each of which includes eight word lines. Among the 128 sectors, a sector including a defective word line or a defective memory cell is hereinafter referred to as a "replacement-target sector". A rescue of the defective part is carried out by replacing eight word lines WL included in the replacement-target sector with the eight redundancy word lines RWL included in the redundancy region.

An address signal ADD[15:0] is a signal specifying an address of a memory cell to be accessed (access-target memory cell). In the address signal ADD[15:0], ADD[8:3] of 6 bits is used for selecting any of 64 bit lines. The remaining ADD[15:9, 2:0] of 10 bits is used for selecting any of 1024 word lines WL[1023:0]. More specifically, any one of the 128 sectors is specified by ADD[15:9] of 7 bits, and any one of eight word lines included in the specified sector is specified by ADD[2:0] of 3 bits.

Further, the replacement-target sector in the 128 sectors is specified by a redundancy address signal RedunADD[6:0] of 7 bits. A redundancy flag RedunFLAGZ is a flag indicating whether or not the replacement (rescue) of word lines should be carried out. For example, the replacement is not carried out when the redundancy flag RedunFLAGZ is set to "H (High Level)", while the replacement is carried out when the redundancy flag RedunFLAGZ is set to "L (Low Level)".

The address comparator 10 shown in FIG. 6 outputs a hit signal HIT, when an access-target memory cell specified by the address signal ADD[15:0] is included in the replacement-target sector. More specifically, the address comparator 10 has the same circuit configuration as shown in FIG. 2. The address comparator 10 compares between the address signal ADD[15:9] specifying a sector and the redundancy address signal RedunADD[6:0] specifying the replacement-target sector. When the redundancy flag RedunFLAGZ is "L" and the address signal ADD[15:9] matches the redundancy address signal RedunAdd[6:0] in all bits, the output hit signal HIT is "H". On the other hand, when the redundancy flag RedunFLAGZ is "H", or the address signal ADD[15:9] does not match the redundancy address signal RedunAdd[6:0] in at least any one bit, the output hit signal HIT is "L".

Figure 7:
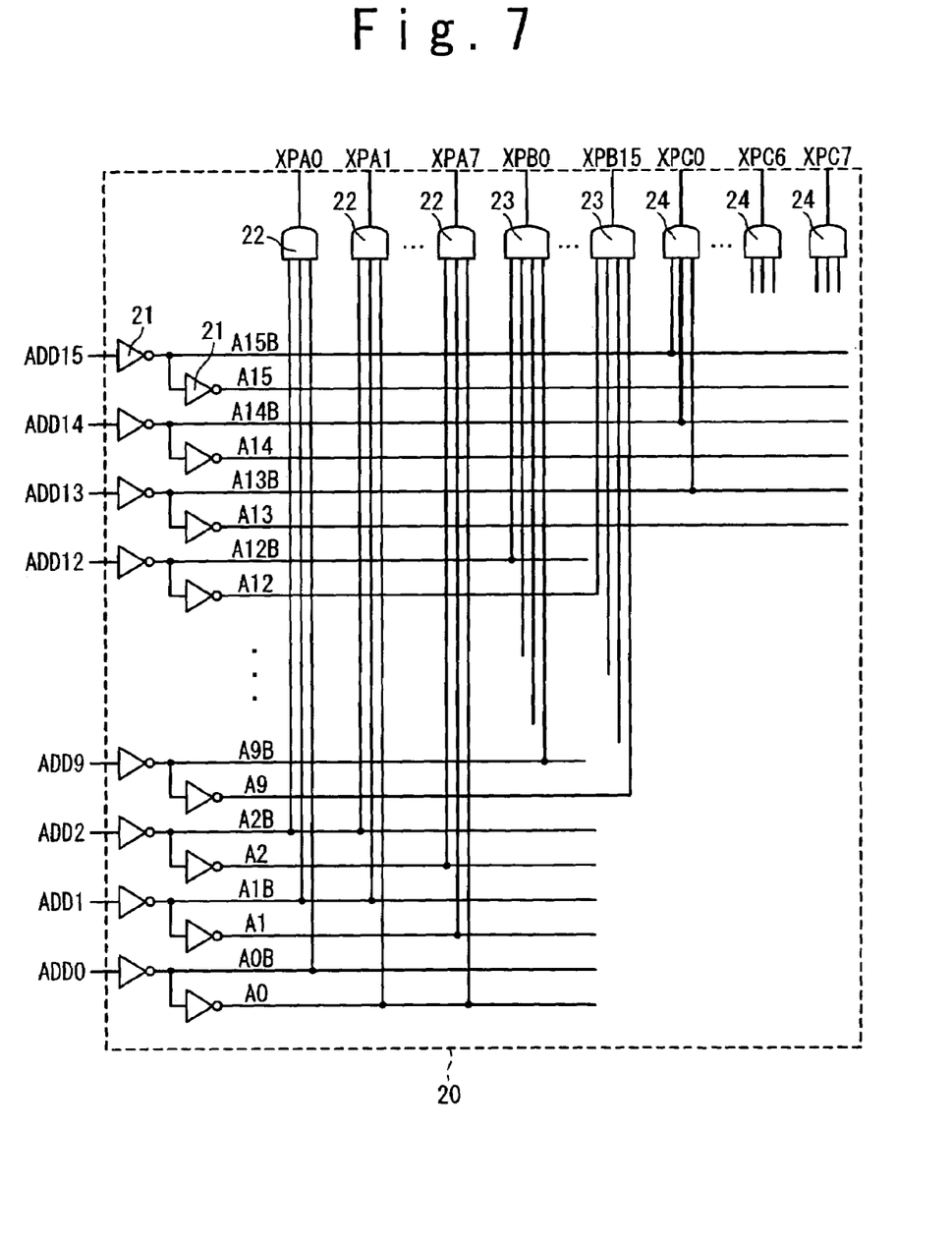
FIG. 7 is a circuit diagram showing an X-predecoder according to the present embodiment.

The X-predecoder 20 shown in FIG. 6 has a circuit configuration as shown in FIG. 7, for example. The X-predecoder 20 decodes the address signal ADD[15:9, 2:0] to generate predecode signals XPA[7:0], XPB[15:0] and XPC[7:0]. More specifically, respective bits of the address signal ADD [15:9, 2:0] are input to respective of a plurality of inverters 21, and signals A0B to A15B are output from respective of the plurality of inverters 21. Further, the signals A0B to A15B are input to respective of a plurality of other inverters 21, and signals A0 to A15 are output from respective of the plurality of other inverters 21.

Input to each of eight AND circuits 22 are any of the signals A2B and A2, any of the signals A1B and A1, and any of the signals A0B and A0. Thus, respective of the eight AND circuits 22 generate respective bits of the predecode signal XPA [7:0]. Further, input to each of 16 AND circuits 23 are any of the signals A12B and A12, any of the signals A11B and A11, any of the signals A10B and A10, and any of the signals A9B and A9. Thus, respective of the 16 AND circuits 23 generate respective bits of the predecode signal XPB[15:0]. Further, input to each of eight AND circuits 24 are any of the signals A15B and A15, any of the signals A14B and A14, and any of the signals A13B and A13. Thus, respective of the eight AND circuits 24 generate respective bits of the predecode signal XPC[7:0].

Any one bit of the predecode signal XPA[7:0], any one bit of the predecode signal XPB[15:0], and any one bit of the predecode signal XPC[7:0] become "H". Here, the predecode signal XPB[15:0] and the predecode signal XPC[7:0] corresponding to the address signal ADD[15:9] are used for selecting any of the 128 sectors. More specifically, any one of eight blocks each including 128 word lines is selected by the predecode signal XPC[7:0]. Then, any one of 16 sectors included in the selected block is selected by the predecode signal XPB[15:0]. Further, any one of eight word lines included in the selected sector is selected by the predecode signal XPA [7:0] corresponding to the address signal [2:0].

As described above, the X-predecoder 20 according to the present embodiment does not depend on the hit signal and operates independently of the hit signal HIT. The X-predecoder 20 is always set to an activated state, irrespective of whether the access-target memory cell specified by the address signal is included in the replacement-target sector or not. The X-predecoder 20 continuously decodes the address signal ADD[15:9, 2:0] and continuously supplies the predecode signals XPA, XPB and XPC to the normal X-main driver 30.

Figure 8:
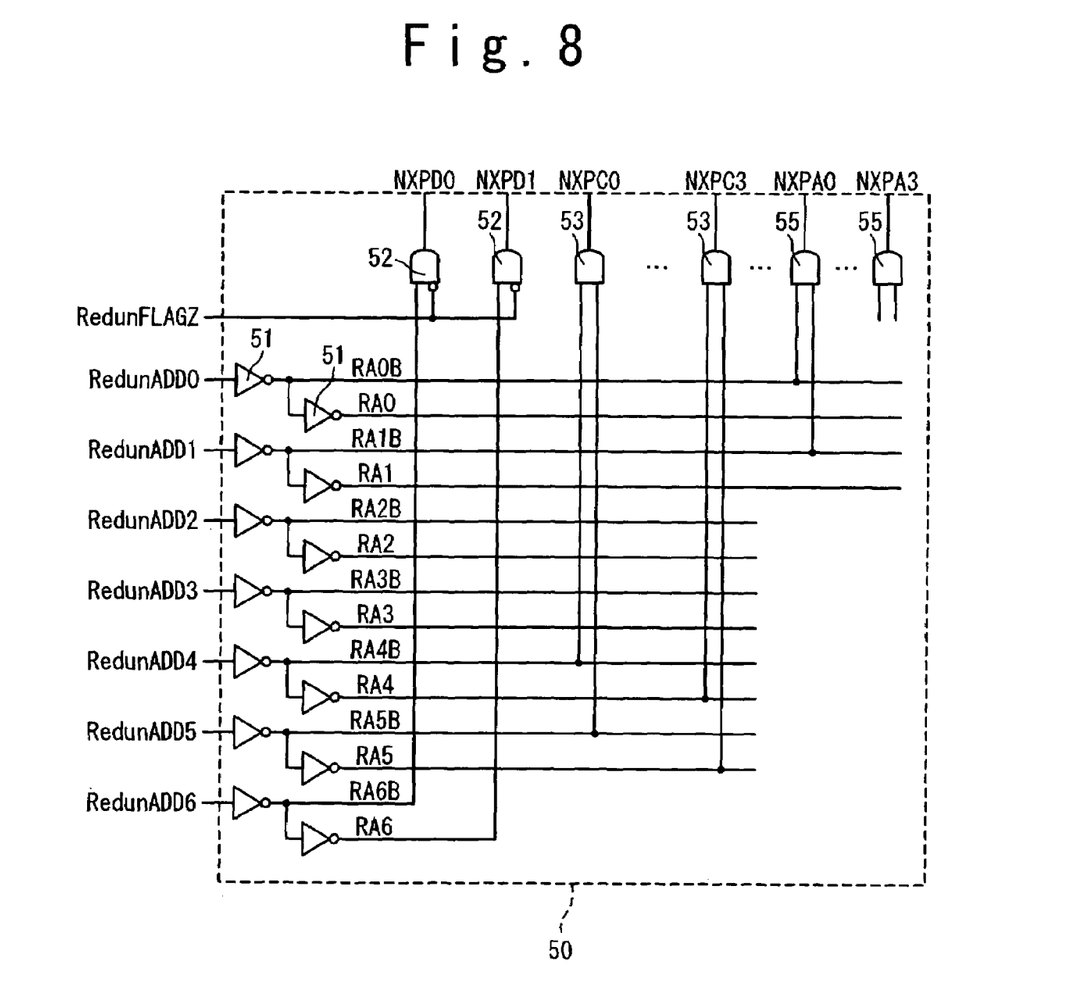
FIG. 8 is a circuit diagram showing a nonselective sector predecoder according to the present embodiment.

The nonselective sector predecoder 50 shown in FIG. 6 has a circuit configuration as shown in FIG. 8, for example. The nonselective sector predecoder 50 decodes the redundancy address signal RedunADD[6:0] to generate predecode signals NXPA[3:0], NXPB[3:0], NXPC[3:0] and NXPD[1:0]. More specifically, respective bits of the redundancy address signal RedunADD[6:01] are input to respective of a plurality of inverters 51, and signals RA0B to RA6B are output from respective of the plurality of inverters 51. Further, the signals RA0B to RA6B are input to respective of a plurality of other inverters 51, and signals RA0 to RA6 are output from respective of the plurality of other inverters 51.

Input to each of four AND circuits 55 are any of the signals RA0B and RA0, and any of the signals RA1B and RA1. Thus, respective of the four AND circuits 55 generate respective bits of the predecode signal NXPA[3:0]. Further, input to each of four AND circuits (not shown) are any of the signals RA2B and RA2, and any of the signals RA3B and RA3. Thus, respective of the four AND circuits generate respective bits of the predecode signal NXPB[3:0]. Further, input to each of four AND circuits 53 are any of the signals RA4B and RA4, and any of the signals RA5B and RA5. Thus, respective of the four AND circuits 53 generate respective bits of the predecode signal NXPC[3:0]. Further, input to each of two AND circuits 52 are any of the signals RA6B and RA6 and the redundancy flag RedunFLAGZ. Thus, respective of the two AND circuits 52 generate respective bits of the predecode signal NXPD[1:0].

When the redundancy flag RedunFLAGZ is "L", any one bit of the predecode signal NXPA[3:0], any one bit of the predecode signal NXPB[3:0], any one bit of the predecode signal NXPC[3:0] and any one bit of the predecode signal NXPD[1:0] become "H". These predecode signals NXPA, NXPB, NXPC and NXPD are the signals obtained by decoding the redundancy address signal RedunADD[6:0] and can designate the "replacement-target sector" out of the 128 sectors. The nonselective sector predecoder 50 according to the present embodiment continuously supplies these predecode signals NXPA, NXPB, NXPC and NXPD to the normal X-main driver 30. It should be noted that all bits of the predecode signal NXPD[1:0] become "L" when the redundancy flag RedunFLAGZ is "H".

Figure 9:
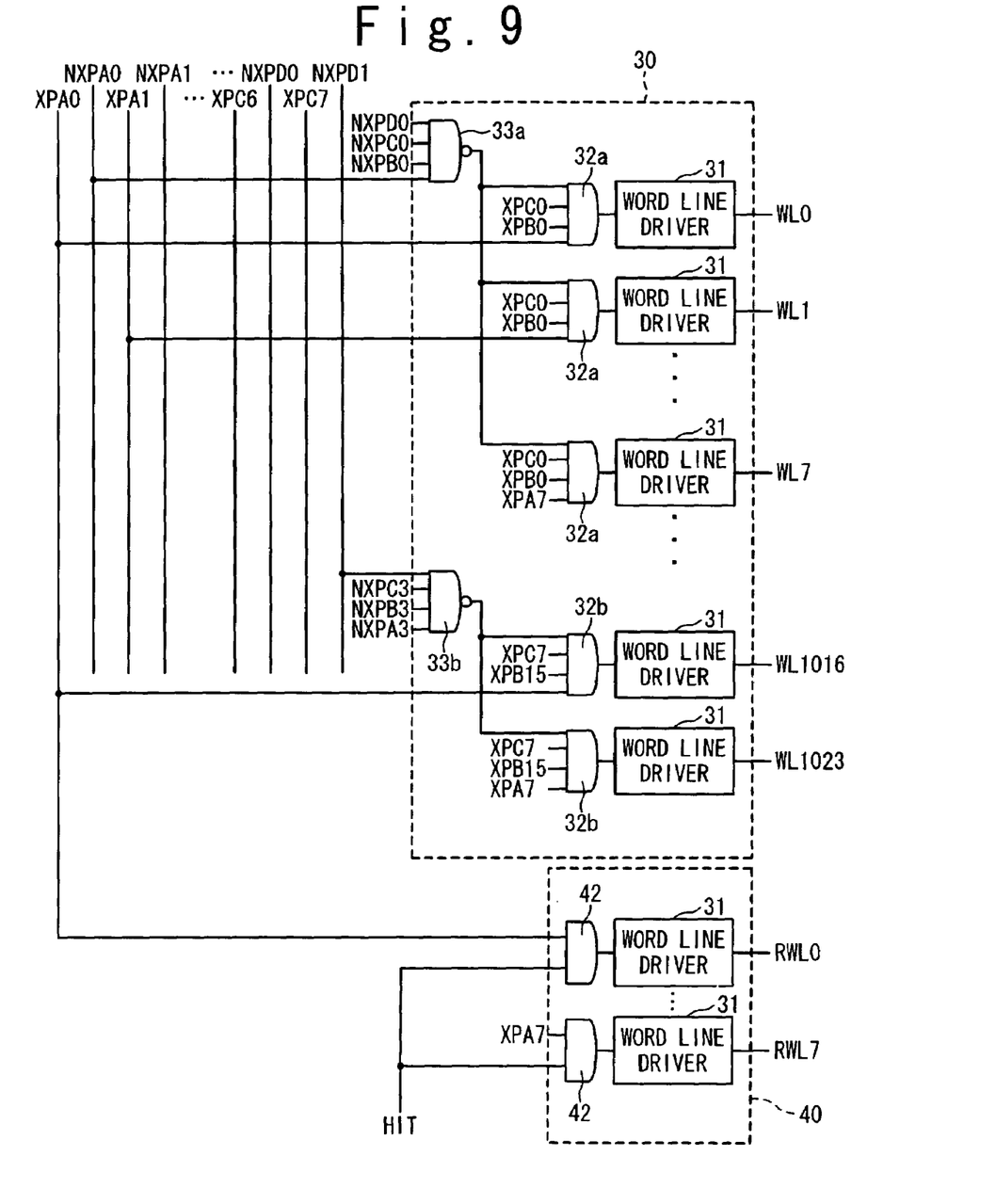
FIG. 9 is a circuit block diagram showing an X-main driver according to the present embodiment.

The normal X-main driver 30 and the redundancy X-main driver 40 shown in FIG. 6 have a circuit configuration as shown in FIG. 9.

First, the normal X-main driver 30 will be explained. The normal X-main driver 30 is provided with 1024 word line drivers 31 connected to respective of the word lines WL[1023:0] of the normal region and 1024 AND circuits 32 connected to respective of the word line drivers 31. An output of each AND circuit 32 is input to the corresponding word line driver 31. When the output of the AND circuit 32 is "H", the corresponding word line driver 31 is selected. The selected word line driver 31 drives the corresponding word line WL (memory cell) in the normal region.

Furthermore, the normal X-main driver 30 according to the present embodiment has 128 NAND circuits 33. The 128 NAND circuits 33 are provided in association with respective of the 128 sectors. For example, an NAND circuit 33a is provided corresponding to a sector including the word lines WL0 to WL7, as shown in FIG. 9. An NAND circuit 33b is provided corresponding to a sector including the word lines WL1016 to 1023, as shown in FIG. 9. Input to each of the NAND circuits 33 are any bit of the predecode signal NXPA [3:0], any bit of the predecode signal NXPB[3:0], any bit of the predecode signal NXPC[3:0], and any bit of the predecode signal NXPD[1:0]. In the case where the redundancy flag RedunFLAGZ is "L", an output of any one of the NAND circuits 33 is fixed to "L" and outputs of the other NAND circuits 33 are fixed to "H".

Input to each of the AND circuits 32 are the output of the corresponding NAND circuit 33 as well as any bit of the predecode signal XPA[7:0], any bit of the predecode signal XPB[15:0] and any bit of the predecode signal XPC[7:0]. For example, the output of the NAND circuit 33a is input to eight AND circuits 32a, and the output of the NAND circuit 33b is input to eight AND circuits 32b. When a certain AND circuit 32 is connected to a NAND circuit 33 whose output is fixed to "L", the output of the certain AND circuit 32 is also fixed to "L". When a certain AND circuit 32 is connected to a NAND circuit 33 whose output is fixed to "H", the output of the certain AND circuit 32 changes in accordance with the predecode signals XPA, XPB and XPC.

Let us consider a case, for example, in which the redundancy flag RedunFLAGZ is "L" and the redundancy address signal RedunADD[6:0] is "0000000". In this case, the sector including the word lines WL0 to WL7 is the "replacement-target sector". In addition, it is assumed that the predecode signals (bits) NXPA0, NXPB0, NXPC0 and NXPD0 are "H", while the other bits are "L". In this case, only the output of the NAND circuit 33a shown in FIG. 9 is fixed to "L", and outputs of the other NAND circuits 33 are fixed to "H". Since the output of the NAND circuit 33a is fixed to "L", outputs of all the AND circuits 32a are also fixed to "L". Therefore, the word lines WL0 to WL7 are not driven. In other words, the replacement-target sector is always set to an unselected state.

As described above, according to the present embodiment, the sector specified by the redundancy address signal RedunADD[6:0] is always set to the unselected state as the replacement-target sector. The reason is that the outputs of the AND circuits 32 associated with the replacement-target sector are fixed to "L" irrespective of the values of the predecode signals XPA, XPB and XPC. In other words, the predecode signals XPA, XPB and XPC associated with the replacement-target sector are masked continuously and hence have no influence on the selection of word line driver 31. What fixes the outputs of the AND circuits 32 associated with the replacement-target sector to "L" is one NAND circuit 33. What fixes the output of the one NAND circuit 33 to "L" is the predecode signals NXPA, NXPB, NXPC and NXPD. Namely, the normal X-main driver 30 according to the present embodiment continuously masks the predecode signals XPA, XPB and XPC associated with the replacement-target sector by referring to the predecode signals NXPA, NXPB, NXPC and NXPD.

One can argue that the above-mentioned AND circuits 32 and the NAND circuit 33 constitute a "selector" for selecting a word line driver 31. The selector continuously receives the predecode signals XPA, XPB and XPC from the X-predecoder 20, and continuously receives the predecode signals NXPA, NXPB, NXPC and NXPD from the nonselective sector predecoder 50. The selector selects one word line driver 31 connected to one word line WL corresponding to the predecode signals XPA, XPB and XPC. Further, the selector does not continuously select a group of word line drivers 31 connected to the replacement-target sector specified by the predecode signals NXPA to NXPD.

Next, the redundancy X-main driver 40 will be explained with reference to the same FIG. 9. The redundancy X-main driver 40 is provided with eight word line drivers 31 connected to respective of the redundancy word lines RWL[7:0] of the redundancy region and eight AND circuits 42 connected to respective of the word line drivers 31. Input to each of the eight AND circuits 42 are the hit signal HIT as well as any bit of the predecode signal XPA[7:0]. An output of each AND circuit 42 is input to the corresponding word line driver 31.

In a case when the HIT signal is "L", the redundancy X-main driver 40 is deactivated. On the other hand, in a case when the HIT signal is "H", namely, in a case when the replacement-target sector is specified, the redundancy X-main driver 40 is activated. Then, one word line driver 31 specified by the predecode signal XPA[7:0] is selected in the redundancy X-main driver 40. The one word line driver 31 thus selected drives the corresponding one redundancy word line RWL (memory cell) in the redundancy region. In this manner, the replacement of the word line WL in the replacement-target sector with the redundancy word line RWL is achieved.

Next, an operation from an address determination to the word line driving will be explained below with reference to a timing chart shown in FIG. 10. In the example shown below, the following situation is considered: when the address signal ADD[15:0] is "0000H" or "FFFFH", a memory cell included in a sector other than the replacement-target sector is designated. When the address signal ADD[15:0] is "0200H", a memory cell included in the replacement-target sector is designated. When the address signal ADD[15:0] is "0000H", the word line WL0 is driven. When the address signal ADD[15:0] is "0200H", the redundancy word line RWL0 is driven. When the address signal ADD[15:01] is "FFFFH", the word line WL1023 is driven. In the X-predecoder 20, the time from the input of the address signal ADD[15:0] to the output of the predecode signals XPA to XPC is 4 ns, which is referred to as a "predecode time". Furthermore, in the address comparator 10, the time from the input of the address signal ADD[15:9] to the output of the hit signal HIT is 4 ns, which is referred to as a "address comparison time".

Figure 10:
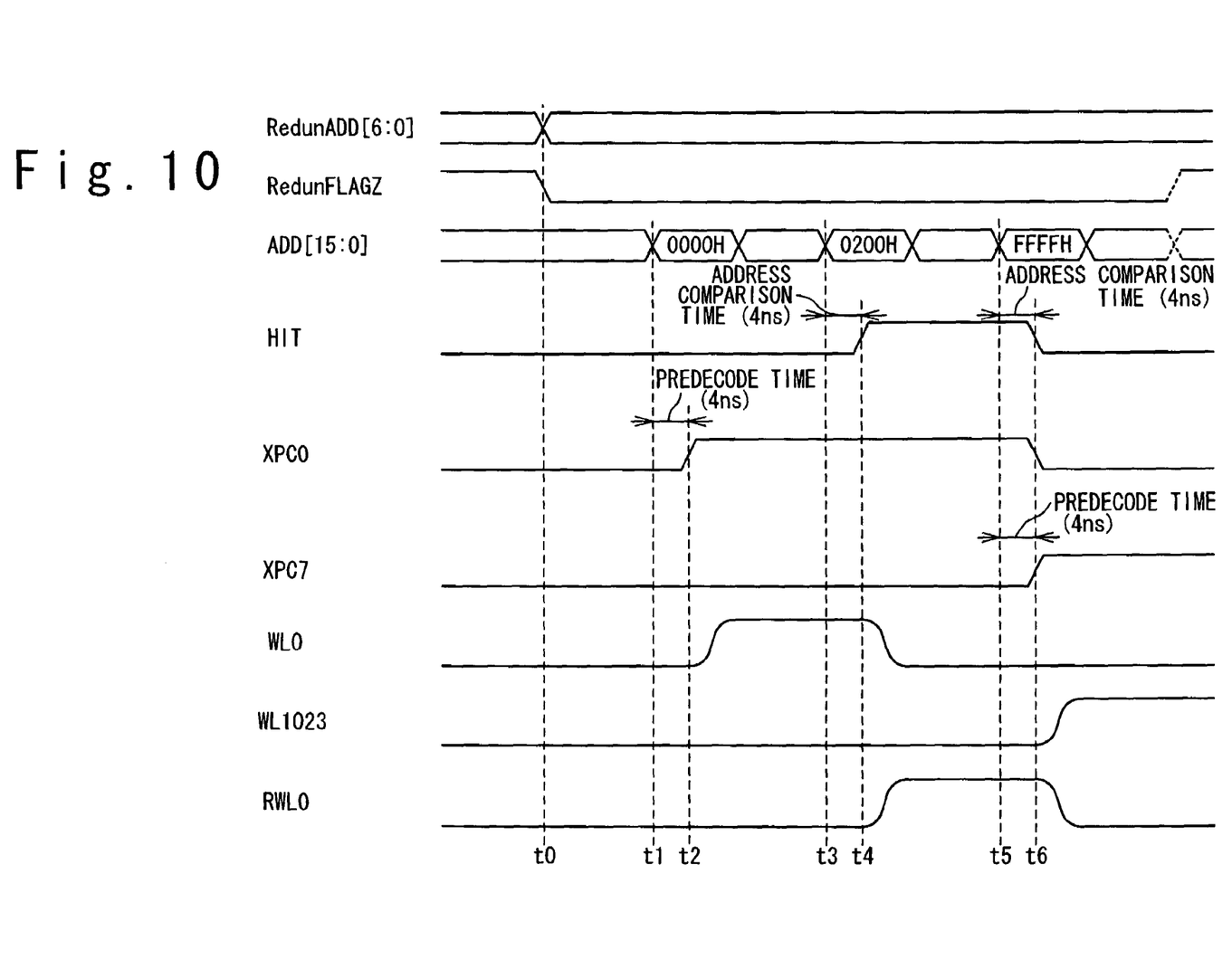
FIG. 10 is a timing chart showing an operation of the semiconductor memory device according to the present embodiment.

With reference to FIG. 10, the redundancy flag RedunFLAGZ changes to "L" at time t0, which enables the replacement of word lines. Further, the redundancy address signal RedunADD[6:0] of "0000001", which is the same as the upper 7 bits of "0200H", is input to the address comparator 10.

Next, at time t1, a read address is determined and the address signal ADD[15:0] becomes "0000H". In this case, since the address signal ADD[15:9] does not match the redundancy address signal RedunADD[6:0], the hit signal HIT remains "L". At time t2 the predecode time (4 ns) after the time t1, the X-predecoder 20 outputs the predecode signals XPA, XPB and XPC to the normal X-main driver 30 (only the XPC0 and XPC7 are shown in FIG. 10). As a result, the word line WL0 in the normal region is driven.

At time t3, a next read address is determined and the address signal ADD[15:0] becomes "0200H". In this case, the address signal ADD[15:9] matches the redundancy address signal RedunADD[6:0]. Therefore, at time t4 the address comparison time (4 ns) after the time t3, the hit signal HIT becomes "H". As a result, the redundancy X-main driver 40 is activated, and the redundancy word line RWL0 in the redundancy region is driven.

In the present embodiment, the operation of the X-predecoder 20 does not change even when the hit signal HIT is changed. In response to the change of the address signal ADD to "0200H" at the time t3, the X-predecoder 20 initiates the predecoding of the new address signal ADD "0200H". Then, at the time t4 the predecode time (4 ns) after the time t3, the X-predecoder. 20 outputs new predecode signals XPA, XPB and XPC to the normal X-main driver 30. As a result, the driving of the word line WL0 corresponding to the previous address signal "0000H" is stopped. Here, a word line WL8 corresponding to the current address signal "0200H" is not driven since it is included in the replacement-target sector. The reason is that the current predecode signals XPA to XPC associated with the replacement-target sector are masked in the normal X-main driver 30, and no word line driver 31 is selected in the normal X-main driver 30.

At time t5, a next read address is determined and the address signal ADD[15:0] becomes "FFFFH". In this case, the address signal ADD[15:9] does not match the redundancy address signal RedunADD[6:0]. Therefore, at time t6 the address comparison time (4 ns) after the time t5, the hit signal HIT becomes "L". As a result, the redundancy X-main driver 40 is deactivated, and the driving of the redundancy word line RWL0 in the redundancy region is stopped.

The operation of the X-predecoder 20 does not change even when the hit signal HIT is changed. In response to the change of the address signal ADD to "FFFH" at the time t5, the X-predecoder 20 initiates the predecoding of the new address signal ADD "FFFFH". Then, at the time t6 the predecode time (4 ns) after the time t5, the X-predecoder 20 outputs new predecode signals XPA, XPB and XPC to the normal X-main driver 30. Thus, the predecode signal XPC0 becomes "L", and the predecode signal XPC7 becomes "H". As a result, the word line WL1023 in the normal region is driven.

As described above, only the predecode time (4 ns) is necessary for driving the word line WL1023 at the time t6 after the address signal "FFFFH" is input at the time t5. This is because the X-predecoder 20 according to the present embodiment is not dependent on the hit signal HIT and is activated all the time. Thus, according to the present embodiment, when the access-target memory cell transits from the redundancy region to the normal region, the timing of the word line driving becomes earlier than that in the conventional technique. In other words, the time from the address determination to the word line driving is reduced as compared with the conventional technique. It is therefore possible to improve the read speed with respect to the access-target memory cell.

It should be noted that the bit line is selected in accordance with the address signal ADD[8:3] by a Y-decoder and a Y-selector which are not shown in FIG. 6. As a result, the access-target memory cell specified by the address signal ADD[15:0] is selected. A read data BIT read out from the selected memory cell is output as an output data DOUT through the sense amplifier 70.

Figure 11:
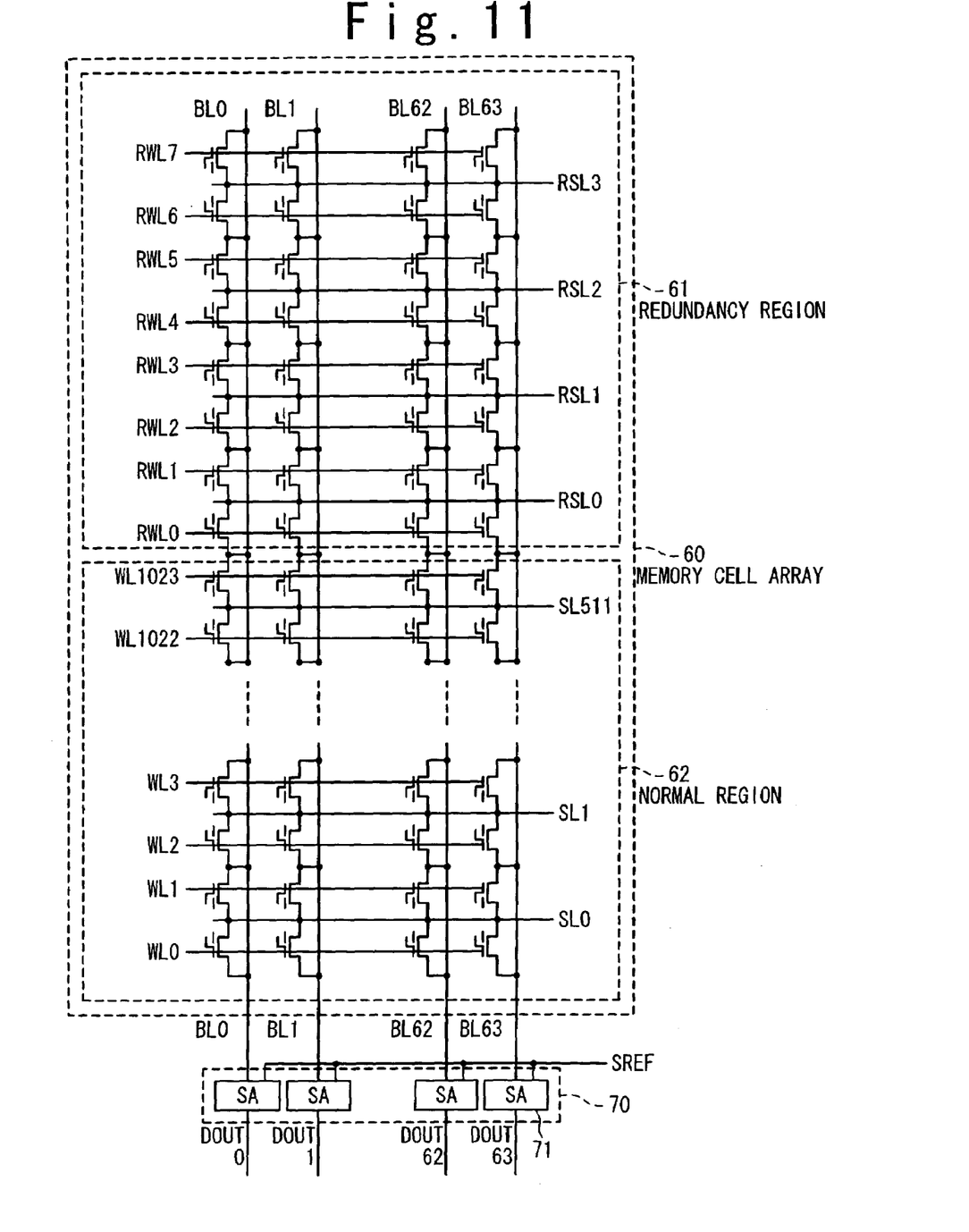
FIG. 11 is a circuit diagram showing a memory cell array according to the present embodiment.

An example of a configuration of the sense amplifier 70 and the memory cell array 60 is shown in FIG. 11. The memory cell array 60 includes a plurality of memory cells that are arranged in a matrix form. The memory cell is exemplified by a nonvolatile memory cell. The memory cell array 60 is sectioned into the normal region 62 in which normal memory cells are provided and the redundancy region 61 with which the defective part is replaced. Formed in the normal region 62 are the word lines WL[1023:0] and source lines SL[511:0]. Formed in the redundancy region 61 are the redundancy word lines RWL[8:0] and redundancy source lines RSL[3:0]. Moreover, common bit lines BL[63:0] are formed in common in the redundancy region 61 and the normal region 62. A gate of one memory cell is connected to one word line WL (or one redundancy word line RWL), a drain thereof is connected to one bit line BL, and a source thereof is connected to one source line SL (or one redundancy source line RSL).

Figure 12:
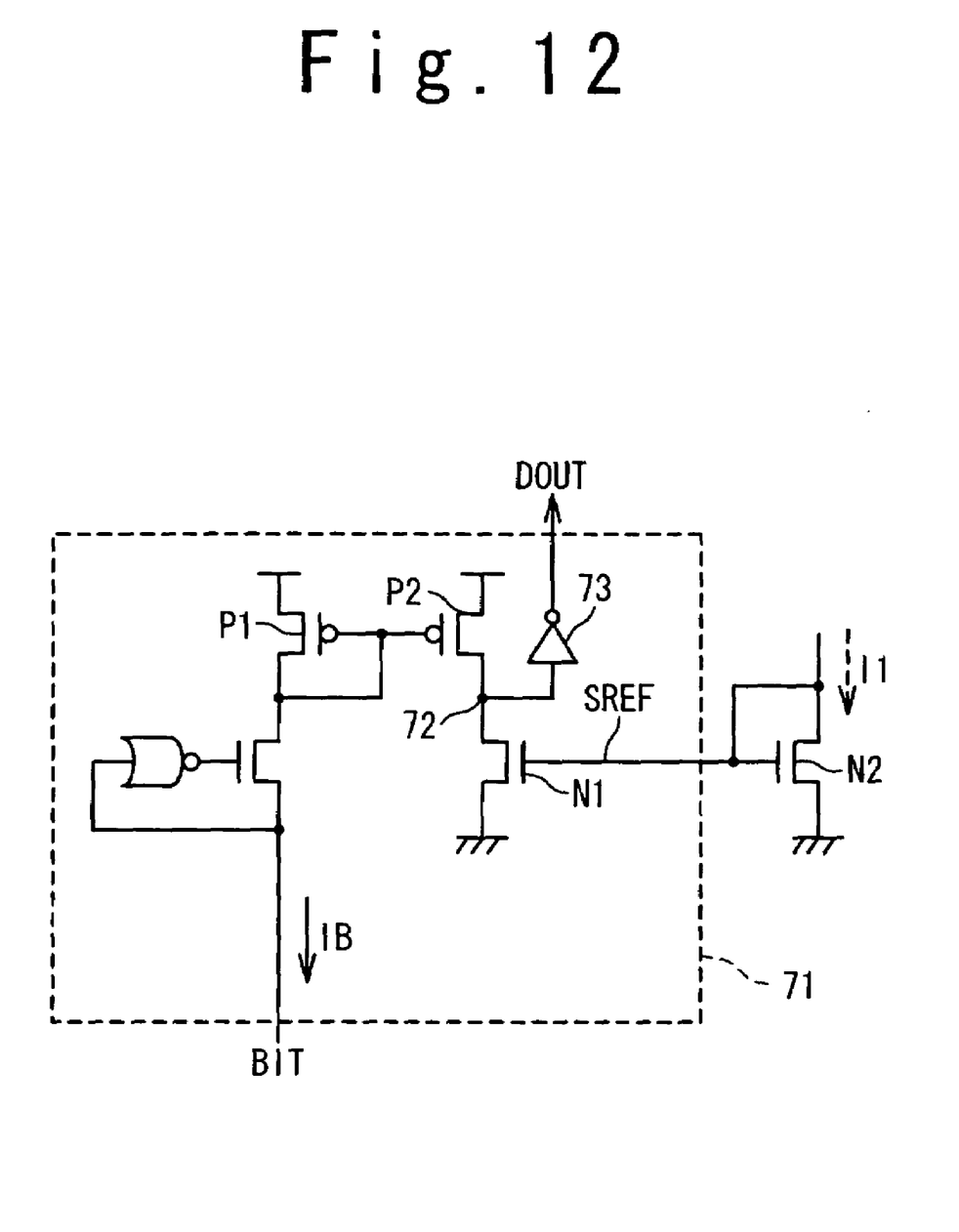
FIG. 12 is a circuit diagram showing a sense amplifier according to the present embodiment.

The sense amplifier 70 includes a plurality of sense amplifier elements 71 which are connected to respective of the bit lines BL[63:0]. FIG. 12 shows a configuration of one sense amplifier element 71. N-channel transistors N1 and N2 constitute one current mirror circuit. A reference current I1 is supplied to the current mirror circuit, and a reference voltage SREF is applied to the gate of each of the transistors N1 and N2. Further, P-channel transistors P1 and P2 also constitute one current mirror circuit. A bit line current IB flowing through the bit line is supplied to the current mirror circuit. Those two current mirror circuits are connected to a node 72, and a potential at the node 72 is input to an inverter 73. The data BIT read out from the selected memory cell is supplied to the sense amplifier element 71 through the bit line BL. Then, the output data DOUT in accordance with a result of comparison between the reference current I1 and the bit line current IB is output from the inverter 73.

As mentioned above, in the present embodiment, the sense amplifier 70 is provided in common with respect to the redundancy region 61 and the normal region 62.

By way of comparison, let us consider a case where separate sense amplifiers are provided for respective of the redundancy region and the normal region. For example, a method can be considered for rescuing the defective part of the memory cell array, in which a selector selects any of a normal memory cell data read out from the normal region and a redundancy memory cell data read out from the redundancy region. In this case, it is necessary to provide sense amplifiers separately for the normal region and the redundancy region. At the time of data reading, both the normal region and the redundancy region are activated, and the normal memory cell data and the redundancy memory cell data are input to the selector through the separate sense amplifiers. When an access-target address does not match a replacement-target address, the selector selects the normal memory cell data. On the other hand, when the access-target address matches the replacement-target address, the selector selects the redundancy memory cell data.

In such a case, a circuit area is increased since a plurality of sense amplifiers are provided. In addition, there is a possibility that a mirror ratio of the above-mentioned current mirror circuit is different in every sense amplifier element due to the process variation in manufacturing transistors. Especially, in a case when the plurality of sense amplifiers are formed in different locations, the variation of the mirror ratio becomes conspicuous. The variation of the mirror ratio results in a difference of delay time of data output, which is not favorable. Furthermore, in the case when the plurality of sense amplifiers are provided, it is necessary for the selector to select either the normal memory cell data or the redundancy memory cell data. Accordingly, the time for outputting the output data DOUT is delayed by as much as the selecting operation.

However, according to the present invention, it is not necessary at the time of the data reading to read out both the normal memory cell data and the redundancy memory cell data. In the case where the access-target address does not match the replacement-target address, the redundancy X-main driver 40 is deactivated and only the normal memory cell data is read out. On the other hand, in the case where the access-target address matches the replacement-target address, only the redundancy memory cell data is read out. The reason is that the memory cells in the replacement-target sector specified by the replacement-target address are set to the unselected state all the time. It is not necessary to read out both the normal memory cell data and the redundancy memory cell data. It is thus possible to provide the common sense amplifier 70 in common with respect to the redundancy region 61 and the normal region 62. Therefore, the circuit area is reduced. Moreover, increase in the time for outputting the output data DOUT is suppressed.

It is apparent that the present invention is not limited to the above embodiment, and that may be modified and changed without departing from the scope and spirit of the invention.

What is claimed is:

1. A semiconductor memory device comprising:
   a memory cell array including a normal region and a redundancy region;
   a first decoder configured to decode an address signal to generate a first decode signal;
   a first driver configured to select a memory cell corresponding to said first decode signal in said normal region; and
   a second driver configured to select a memory cell in said redundancy region when a memory cell specified by said address signal is included in a replacement-target sector in said normal region,
   wherein in said first driver, said first decode signal associated with said replacement-target sector is masked continuously.

2. The semiconductor memory device according to claim 1, wherein said first decoder continuously executes decoding of said address signal and continuously supplies said first decode signal to said first driver.

3. The semiconductor memory device according to claim 1, wherein said first decode signal associated with said replacement-target sector is masked continuously regardless of a result of a comparison between said address signal and a redundancy address signal specifying said replacement-target sector.

4. The semiconductor memory device according to claim 1, further comprising a second decoder configured to decode a redundancy address signal specifying said replacement-target sector to generate a second decode signal,
   wherein said second decoder continuously supplies said second decode signal to said first driver, and said first driver continuously masks said first decode signal associated with said replacement-target sector with reference to said second decode signal.

5. The semiconductor memory device according to claim 4, further comprising a comparator configured to compare said address signal and said redundancy address signal,
   wherein said comparator outputs a hit signal for activating said second driver to said second driver if a memory cell specified by said address signal is included in said replacement-target sector.

6. The semiconductor memory device according to claim 5, wherein when activated by said hit signal, said second driver selects a memory cell in said redundancy region by using said first decode signal.

7. The semiconductor memory device according to claim 5, wherein said first decoder operates independently of said hit signal.

8. The semiconductor memory device according to claim 1, wherein said first driver drives any of a plurality of word lines provided in said normal region, and said second driver drives any of a plurality of redundancy word lines provided in said redundancy region.

9. The semiconductor memory device according to claim 8, further comprising a sense amplifier connected to a plurality of bit lines which are provided in common in said normal region and said redundancy region.

10. The semiconductor memory device according to claim 8,
    wherein said first driver has:
    a plurality of word line drivers connected with respective of said plurality of word lines; and
    a selector connected to said plurality of word line drivers,
    wherein said selector receives said first decode signal and a second decode signal that is obtained by decoding a redundancy address signal specifying said replacement-target sector,
    wherein said selector is configured to select one word line driver of said plurality of word line drivers that is connected to one word line of said plurality of word lines corresponding to said first decode signal, and not to continuously select a word line driver group of said plurality of word line drivers that is connected to a word line group of said plurality of word lines included in said replacement-target sector specified by said second decode signal, and said selected one word line driver drives said one word line.

11. The semiconductor memory device according to claim 1,
    wherein said first driver drives any of a plurality of bit lines provided in said normal region, and said second driver drives any of a plurality of redundancy bit lines provided in said redundancy region.

12. The semiconductor memory device according to claim 1,
    wherein said memory cell array has a plurality of nonvolatile memory cells that are arranged in a matrix form.

* * * * *